United States Patent
Sakai et al.

[11] Patent Number: 5,932,921
[45] Date of Patent: Aug. 3, 1999

[54] SENSOR CHIP HAVING A DIODE PORTIONS AND A THIN-WALL PORTION

[75] Inventors: Minekazu Sakai, Kariya; Inao Toyoda, Okazaki; Nobukazu Oba, Gamagori, all of Japan

[73] Assignee: Denso Corporation, Kariya, Japan

[21] Appl. No.: 08/958,319

[22] Filed: Oct. 27, 1997

[30] Foreign Application Priority Data

Oct. 25, 1996 [JP] Japan ................................. 8-283940

[51] Int. Cl.$^6$ .................................................. H01L 29/82
[52] U.S. Cl. ...................... 257/419; 257/415; 257/417; 257/418
[58] Field of Search .................... 257/415, 417, 257/418, 419

[56] References Cited

U.S. PATENT DOCUMENTS

| Re. 34,893 | 4/1995 | Fujii | 257/419 |
|---|---|---|---|
| 5,511,428 | 4/1996 | Goldberg et al. | 73/777 |
| 5,514,898 | 5/1996 | Hartaner | 257/417 |
| 5,614,753 | 3/1997 | Uchikoshi et al. | 257/417 |

FOREIGN PATENT DOCUMENTS 6-45618  2/1994  Japan .

*Primary Examiner*—Ngân V. Ngô
*Attorney, Agent, or Firm*—Pillsbury Madison & Sutro LLP

[57] ABSTRACT

When a diaphragm portion of the pressure sensor or the like is fabricated, anisotropic etching is needed. This etching is carried out by electrochemically stopped etching. During this process, a voltage is applied to the diaphragm portion. A diode is connected between said diaphragm portion and an integrated circuit to prevent the voltage from being applied to the integrated circuit connected with the diaphragm portion. The diode is obtained by shorting the base and collector of a lateral p-n-p transistor to each other. A collector region is formed offset from immediately under a conductor pattern to prevent a parasitic MOS effect from producing a channel serving as a leakage current path. Further, a heavily doped n-type diffused region acting as a channel stopper is formed along the outer periphery of the collector region.

15 Claims, 8 Drawing Sheets

SENSOR CHIP HAVING A DIODE PORTIONS AND A THIN-WALL PORTION

CROSS REFERENCE TO RELATED APPLICATION

This application is based upon and claims the benefit of priority of prior Japanese Patent Application No. H. 8-283940 filed on Oct. 25, 1996, the contents of which are incorporated by reference.

BACKGROUND OF THE INVENTION

1. Field of the Invention

The present invention relates to a semiconductor device having a thin-walled portion formed by electrochemical etching and to a method of fabricating such a semiconductor device.

2. Description of the Related Art

A known semiconductor pressure sensor is fabricated by forming a thin-walled portion in a part of a silicon substrate serving as a semiconductor substrate. The thin-walled portion is used as a diaphragm. Diffused resistors are formed on this diaphragm. The resistance values of these diffused resistors are varied in response to the pressure applied to the diaphragm by a piezoresistance effect. These diffused resistors are connected together to form a bridge circuit via an interconnection pattern. When a pressure is applied to the diaphragm, the bridge circuit is off balance and produces a voltage signal corresponding to the pressure.

In order that the aforementioned sensor detects a pressure accurately, the diaphragm is formed by anisotropic etching processing that relies on an electrochemically stopped etching method showing good controllability about the thickness of the diaphragm. In this electrochemically stopped etching method, anisotropic etching is done within aqueous solution of potassium hydroxide or the like while a predetermined reverse voltage is applied across a portion corresponding to the diaphragm. A depletion layer is produced by the application of the reverse voltage. As the etching progresses, the depletion layer becomes exposed to an etchant. As a result, an electrical current is induced. Thus, the etching is stopped. Using this phenomenon, a diaphragm having a desired thickness is obtained.

A monolithically integrated pressure-detecting circuit may be formed on a chip of a pressure sensor. In this construction, when electrochemically stopped etching is performed as described above, preventing the current from flowing into the integrated pressure-detecting circuit is necessary. Accordingly, in one conventional structure, a diode structure is inserted in a path going from the integrated circuit to the diffused resistors of the diaphragm, thus preventing the inflow of the electrical current to the integrated pressure-detecting circuit.

FIG. 15 shows one sensor chip 1, or semiconductor pressure sensor, of a multiplicity of pressure sensors formed on a silicon wafer. Diffused resistors 3 (see FIG. 16) exhibiting a piezoresistance effect are formed on a diaphragm portion 2. The detection signals from diffused resistors 3 are processed by an integrated circuit 4. A conductor pattern 5 to feed voltage during etching is formed along scribe lines at the outer periphery of the sensor chip 1. The conductor pattern 5 is connected via a diode portion 6a with a conductor pattern 7 on the side of the diaphragm portion 2. The integrated circuit 4 is connected with the conductor pattern 7 through a conductor pattern 4a, a power supply pad 4b, and a diode portion 6b.

As shown in the cross-sectional view of FIG. 16, lateral p-n-p transistors are used as the diode portions 6a and 6b so that an electrical current flows near the surface of the sensor chip 1. An n-type epitaxial layer 1b is formed on a p-type silicon substrate 1a forming the sensor chip 1. This epitaxial layer 1b is divided into a diaphragm region 9 and diode regions 10a, 10b by p-type diffused, isolating regions 8.

Heavily doped, n-type buried layers 11a and 11b are formed in the diode regions 10a and 10b, respectively. Also, p-type diffused collector regions 12a, 12b and p-type emitter regions 13a, 13b are formed in the diode regions 10a and 10b, respectively. These diode regions 10a and 10b are used as base regions. Heavily doped n-type diffused regions 14a and 14b are formed in these base regions, respectively, to make contacts with the conductor pattern 7. The diffused collector regions 12a and 12b surround the diffused emitter regions 13a and 13b, respectively. The conductor pattern 5 formed along the outer periphery of the sensor chip 1 is connected with the diffused emitter region 13a of the diode portion 6a. The conductor pattern 7 is disposed so that the diffused collector region 12a, 12b and the heavily doped n-type diffused region 14a, 14b are shorted to each other.

In the above-described structure, numerous sensor chips (such as the chip 1) are formed. When the rear side of the diaphragm portion 2 of each sensor chip 1 is etched away, an external power supply 16 applies a positive voltage from the voltage-applying conductor pattern 5 to the diaphragm portion 2 via the diode portion 6a. At this time, the diode portion 6b prevents an electrical current from flowing into the integrated circuit 4. Consequently, etching can be carried out while immersing the sensor chips 1, or silicon wafer, in an etchant within an etch bath (not shown). During this process, a voltage is applied between the silicon wafer, or the sensor chips 1, and a counter electrode 17.

When the silicon wafer is cut into individual sensor chips 1 for use, a voltage is applied from the power supply pad 4b to the diffused resistors 3 on the diaphragm portion 2. Also, in this case, the diode portion 6a prevents an electrical current from flowing into the conductor pattern 5.

The diode portion 6b of the above-described prior art construction produces the following troubles. When the diaphragm portion 2 is left as a thick film by electrochemically stopped etching processing, it is necessary to increase the applied voltage so that the depletion layer is widened. Because the diode portion 6b is constructed as shown in FIGS. 17 and 18, the n-type diode region 10b becoming a base region exists just under the conductor pattern 4a via an insulating film 18, the conductor pattern 4a being electrically connected with the diffused emitter region 13b. Therefore, if a positive voltage is applied to this conductor pattern 7 via the diode portion 6a, an inversion layer is formed in a surface layer of the n-type diode region 10b. This becomes channels 19a and 19b (FIG. 19), thus completing a p-channel MOS transistor that electrically connects the p-type diffused collector region 12b with the p-type diffused emitter region 13b or with the diffused isolating regions 8.

This is described in further detail below. As shown in FIG. 16, when a high voltage is applied to the conductor pattern 5 from the external power supply 16, this voltage is impressed on the conductor pattern 7 connected with the diode portion 6b via the diode portion 6a. Since the collector region 12b and n-type diffused region 14b are connected with the conductor pattern 7, the potential in the diode region 10b of the diode portion 6b is raised via this n-type diffused region 14b. Because the conductor pattern 4a located over the diode region 10b is maintained at a low potential, the resulting potential difference creates an inversion layer near the surface of the diode region 10b. In this way, a parasitic transistor is formed on the diode portion 6b. As a result, an electrical current leaks into the integrated circuit 4 through a path from the diffused collector region 12b located under the conductor pattern 4a to the diffused emitter region 13b via the channel inversion layer.

Also, an electrical current leaks from other than the diaphragm portion 2 through a path that goes from the diffused collector region 12b to the silicon substrate 1a via the channel and via the diffused isolating region 8. Therefore, the operation of the diode portion 6b is hindered. This makes the electrochemically stopped etching processing unreliable. In the past, therefore, performing the electrochemically stopped etching processing by applying a high voltage has been difficult. The actual situation is that, when this structure of a diode is adopted, it is substantially impossible to apply a voltage higher than approximately 15 V.

SUMMARY OF THE INVENTION

It is an object of the present invention to provide a semiconductor device which has a diode portion to prevent current leakage and which enables performance of electrochemically stopped etching when a high voltage is applied.

A semiconductor device according to the present invention has a thin-walled portion formed in a predetermined region of a semiconductor substrate by electrochemically stopped etching. The semiconductor device further comprises a circuit portion electrically connected with the thin-walled portion, a first diode portion for suppressing reverse current, the first diode portion being located in a current path going from outside to the thin-walled portion during electrochemically stopped etching, and a second diode portion for suppressing reverse current, the second diode portion being located in a current path going from the circuit portion to the thin-walled portion. A leakage-current hindering portion is formed in the second diode portion to hinder a leakage current from flowing through a leakage current path created by a parasitic element produced in the second diode portion by a voltage applied during electrochemically stopped etching. As a result, the leakage-current hindering portion certainly prevents leakage current which would otherwise flow into other than a thin-walled portion by adverse effect of a parasitic element created by the voltage applied to the semiconductor substrate during electrochemically stopped etching. Hence, the voltage applied during the electrochemically stopped etching can be made higher than heretofore. Consequently, the thickness of the thin-walled portion can be selected from a wider range of dimensions than conventional in forming the thin-walled portion. This can offer wider latitude in designing the device.

A channel stopper for providing a channel stop in a parasitic MOS transistor can be formed as the aforementioned leakage-current hindering portion. Therefore, even if an inversion layer is formed in the parasitic MOS transistor, the inversion layer disappears in the channel-stopper. As a whole, no channel is created. In consequence, formation of a path for leakage current can be prevented.

The above-described leakage-current hindering portion can be formed by forming a diffused region in such a way that it is offset from just under an electrode pattern connected with the second diode portion. This prevents creation of any parasitic MOS structure. As a result, leakage current from the second diode portion can be prevented.

In a further feature of the invention, each diode portion is formed by making use of a lateral transistor. As a result, an electrical current can pass through a surface portion in the semiconductor substrate. This can reduce the electrical current leaking into the semiconductor substrate to a minimum.

In a still other feature of the invention, the thin-walled portion is used as a diaphragm displaced in response to a pressure. Thus, the device can be applied to a pressure sensor. The thickness of the diaphragm can be selected from a wide range of dimensions. Also, accurate machining of the diaphragm is possible.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

Sensor chips of semiconductor pressure sensors to which the present invention is applied are hereinafter described by referring to FIGS. 1 to 14.

Figure 5:
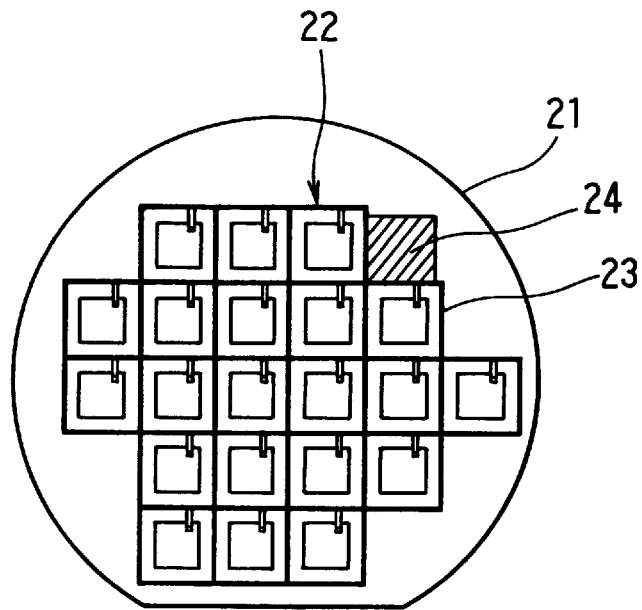
FIG. 5 is a top view of a wafer having numerous sensor chips including the one shown in FIGS. 3 and 4.

FIG. 5 shows the state of a silicon wafer 21 subjected to electrochemical etching. A multiplicity of sensor chips 22 are formed on this wafer 21. Conductor patterns 23 are created along scribe lines defining the outer peripheries of the sensor chips 22. The conductor patterns 23 are connected with an electrode portion 24 formed in a part of the silicon wafer 21.

Figure 6:
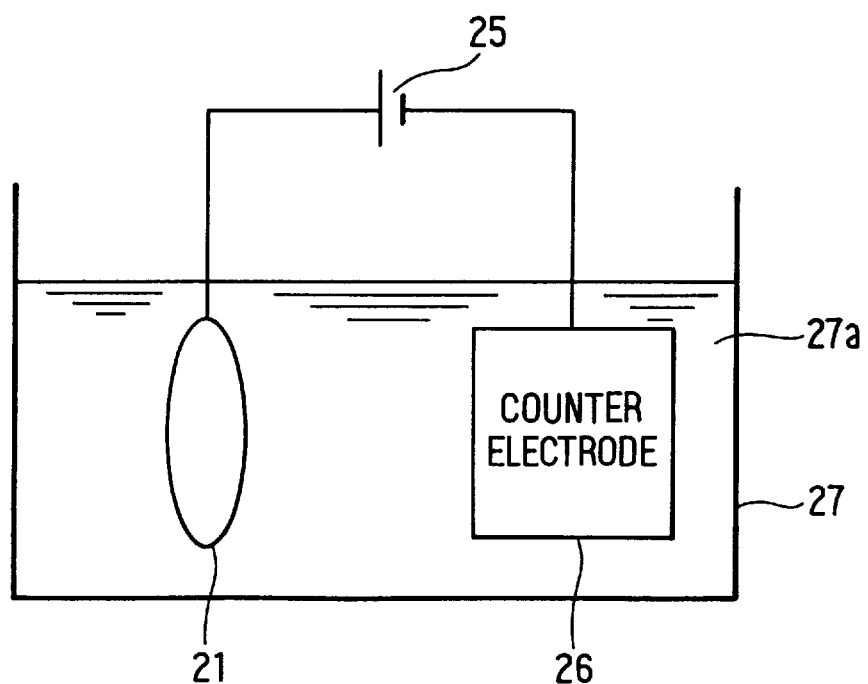
FIG. 6 is a schematic view of an apparatus for performing electrochemically stopped etching used in the present invention.

Electrochemical etching (described later) is performed under the condition shown in FIG. 6. That is, the electrode portion 24 of the silicon wafer 21 is connected with the positive terminal of an external direct current power supply 25, while a counter electrode 26 of platinum (Pt) is connected with the negative terminal. The silicon wafer 21 and the counter electrode 26 are immersed in an anisotropic alkaline etchant 27a within an etch bath 27 to carry out anisotropic etching. This etchant is potassium hydroxide (KOH of 25 to 40 weight %) solution. A thin-walled portion is formed in a desired portion of the sensor chip 22 by performing the electrochemically stopped etching under this condition. It is to be noted that electrochemical etching is described in detail in U.S. patent Ser. No. 08/637,128 which is incorporated by reference.

Figure 1:
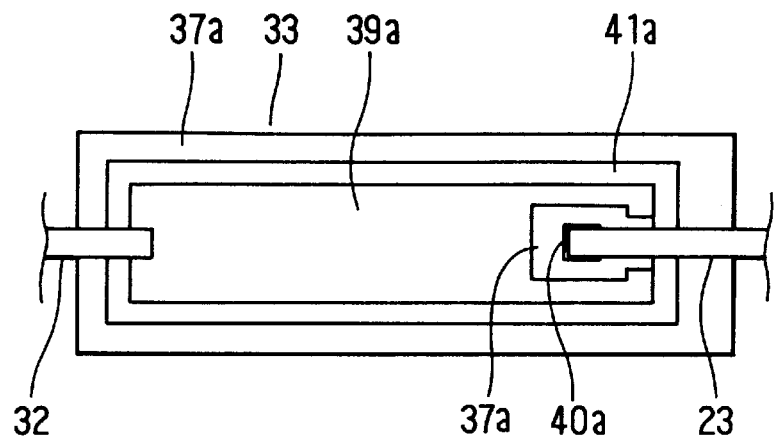
FIG. 1 is a top view of a diode portion in a preferred embodiment of the present invention.
Figure 2:
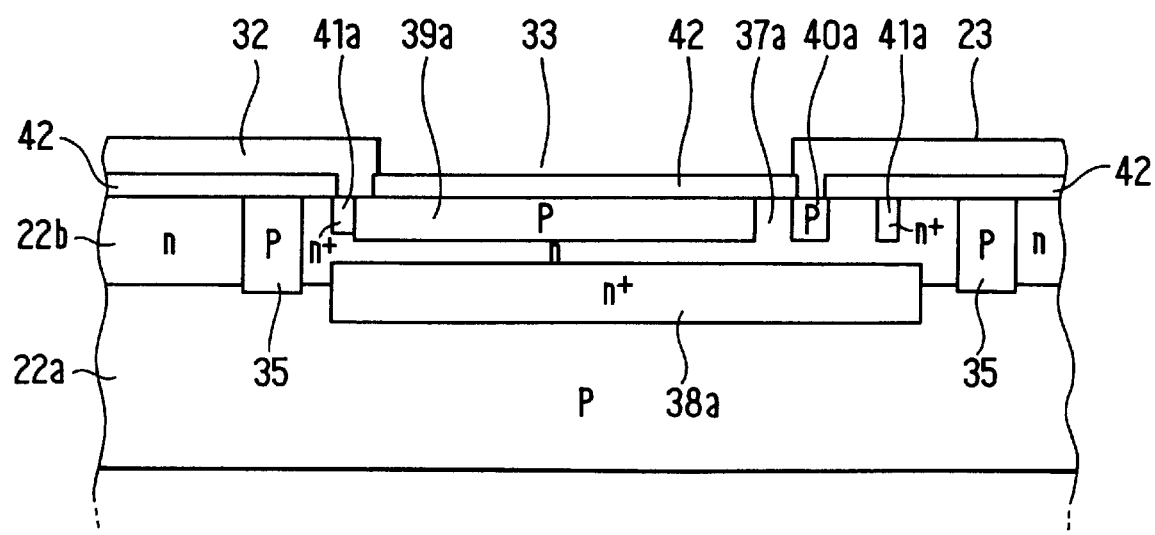
FIG. 2 is a schematic cross section of the diode portion shown in FIG. 1.
Figure 3:
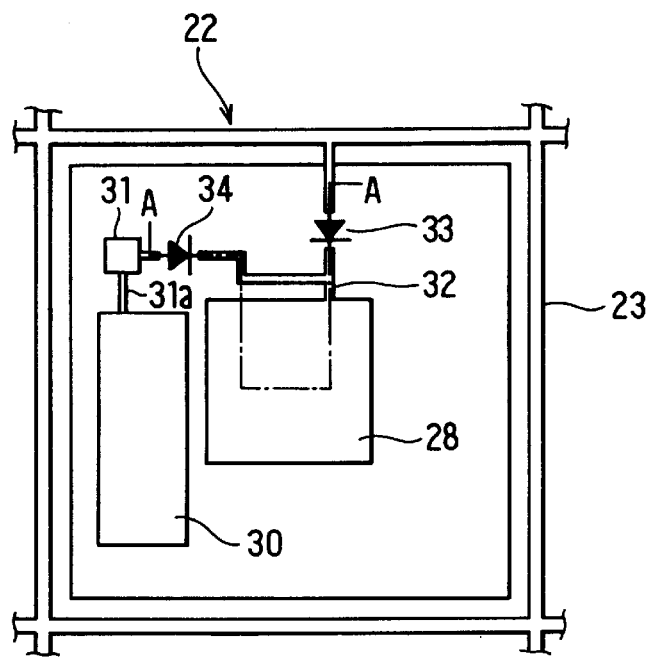
FIG. 3 is a top view of a sensor chip according to the preferred embodiment of the present invention.
Figure 4:
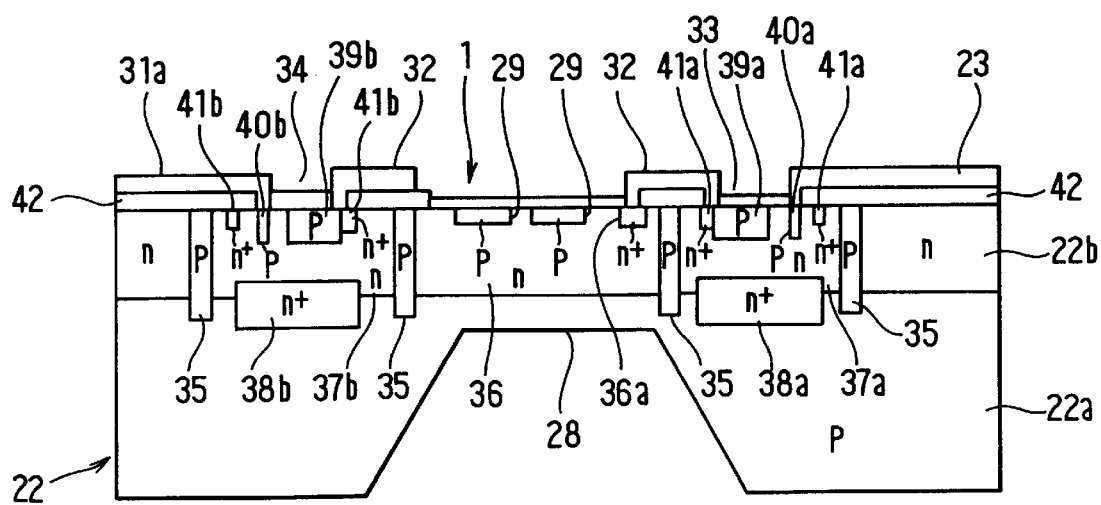
FIG. 4 is a schematic cross section taken along line A—A of FIG. 3.

FIG. 3 shows the sensor chip 22 as viewed from above. The sensor chip 22 is fabricated by passing through electrochemically stopped etching as described above. FIG. 4 is a schematic cross section of this sensor chip 22. FIG. 1 is a schematic top view of a diode portion 33. FIG. 2 is a schematic cross section of the diode portion 33. A diaphragm portion 28 constituted by the thin-walled portion is formed in the center of the sensor chip 22. The rear side of the diaphragm portion 28 is shaped into a rectangular concave form. A plurality of diffused resistors 29 exhibiting a piezoresistance effect are formed on the surface of the diaphragm portion 28. The diffused resistors 29 produce signals which vary in response to the pressure applied to the diaphragm portion 28. An integrated circuit 30 processes these output signals from the diffused resistors 29 and produces an output signal representing the detected pressure. The integrated circuit 30 is connected with a power supply pad 31 via a conductor pattern 31a.

Another conductor pattern 32 is connected with the diffused resistors 29 of the diaphragm portion 28 so that the diffused resistors 29 forms a bridge circuit. This conductor pattern 32 on the side of the feeding terminal of the bridge circuit extends from the diaphragm portion 28. The conductor pattern 23 formed along the outer periphery of the sensor chip 22 is connected with the conductor pattern 32 via a first diode portion 33. The power supply pad 31 is connected with the conductor pattern 32 via a second diode portion 34.

In the bridge circuit composed of the above-described diffused resistors 29, no voltage appears across the output terminals when no pressure is exerted on the diaphragm portion 28 if electric power is supplied from outside. However, when a pressure is applied to the diaphragm portion 28 and this diaphragm portion 28 is distorted, the resistance values of the diffused resistors 29 are varied by the piezoresistance effect according to the direction of distortion. The resulting change appears as a change in the voltage between the output terminals of the bridge circuit. The pressure is detected by detecting this voltage.

Lateral p-n-p transistors are used as the first and second diode portions 33 and 34 so that an electrical current flows near the surface of the sensor chip 22. An n-type epitaxial layer 22b is formed on a p-type silicon substrate 22a forming the sensor chip 22. This epitaxial layer 22b is divided into a diaphragm region 36 and diode regions 37a, 37b by p-type diffused isolating regions 35.

The diode regions 37a, 37b become the base regions of p-n-p transistors. Since the structures of the diode regions 37a, 37b are substantially the same, only the structure of the diode region 37a is described with reference to FIGS. 1 and 2. As shown in FIGS. 1 and 2, a heavily doped buried layer 38a has been previously formed at the interface between the silicon substrate 22a and the epitaxial layer 22b. A p-type collector region 39a and a p-type emitter region 40a are formed from the surface side by diffusion. In this case, the collector region 39a is shaped like the letter "U" in a plane and surrounds the diode region 37 and the emitter region 40 as shown in FIG. 1. Since the collector region 39a assumes the U-shaped form in this way, this region acts as a leakage-current hindering portion.

A heavily doped n-type diffused region 41a is formed around the outer periphery of the collector region 39a and in contact with the outer periphery thereof. This n-type diffused region 41a is one of leakage-current hindering portions acting as a channel stopper. The conductor pattern 32 is connected so that the n-type diffused region 41a and the collector region 39a are shorted to each other. The conductor pattern 23 is connected with the emitter region 40a. A dielectric film 42 made of silicon oxide or the like is formed on the surfaces of the other portions. The withstand voltage between the emitter and collector can be set to about 50 V or more by the structure described thus far. For example, electrochemically stopped etching can be performed while applying a voltage of approximately 30 to 40 V. The sensor chip 22 constructed in this manner is manufactured by a process sequence summarized below.

Figure 7:
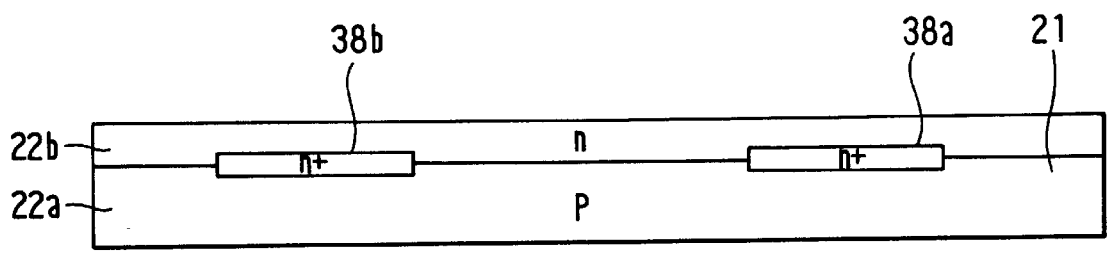
FIGS. 7 to 14 are schematic cross sections illustrating a process sequence for fabricating a sensor chip.

As shown in FIG. 7, the silicon wafer 21 comprising the p-type silicon substrate 22a on which the n-type epitaxial layer 22b is deposited is used. The silicon substrate 22a has a (100) or (110) surface orientation. N-type dopants have been previously deposited at a heavy dose in desired regions of the silicon substrate 22a. Accordingly, when the epitaxial layer 22b is formed on the silicon substrate 22a, the heavily doped buried layers 38a, 38b are obtained.

Figure 8:
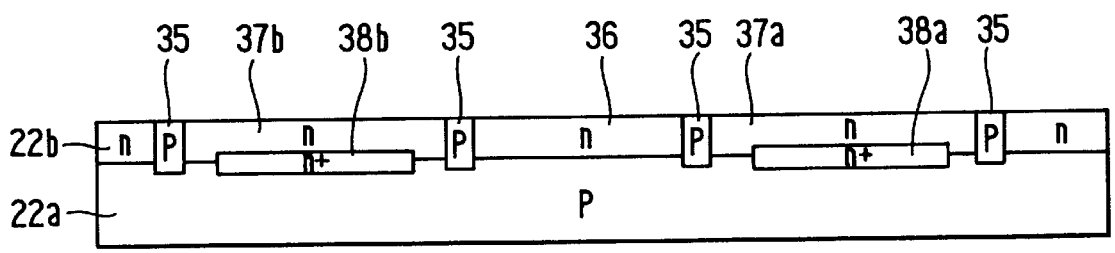

Then, as shown in FIG. 8, in order to partition the n-type epitaxial layer 22b into desired regions, the p-type diffused isolating regions 35 are formed so as to extend into the silicon substrate 22a. Thus, the n-type diaphragm region 36 and the n-type diode regions 37a, 37b are isolated by the p-type diffused isolating regions 35.

Figure 9:
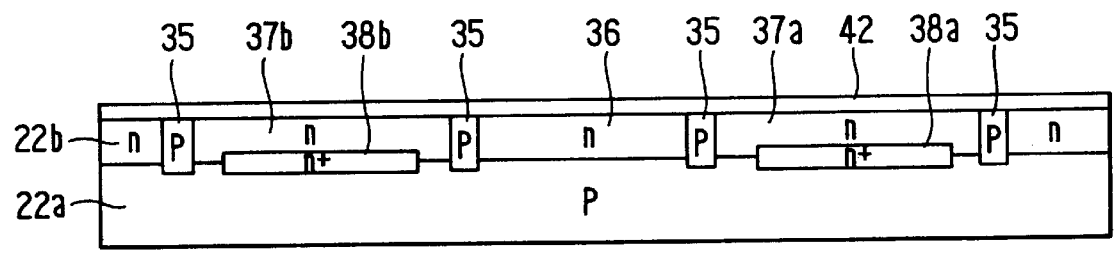

Subsequently, as shown in FIG. 9, the silicon oxide film 42 of desired thickness is formed on the surface of the silicon wafer 21, thus protecting the surface.

Figure 10:
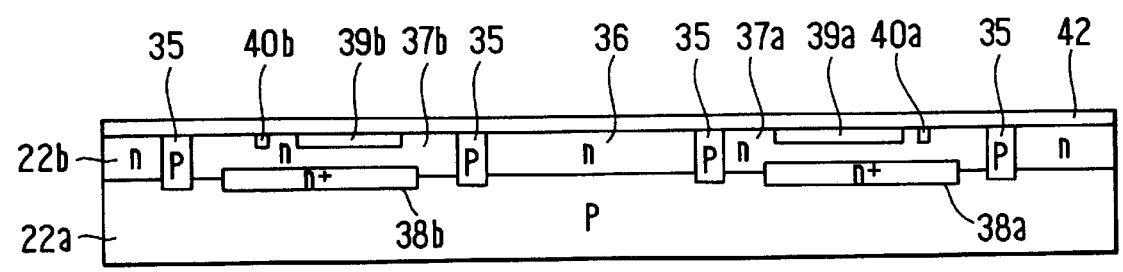

Thereafter, as shown in FIG. 10, dopants are introduced at a high dose into the diode regions 37a, 37b. Thus, the p-type collector regions 39a, 39b and the emitter regions 40a, 40b are grown to a desired depth by diffusion.

Figure 11:
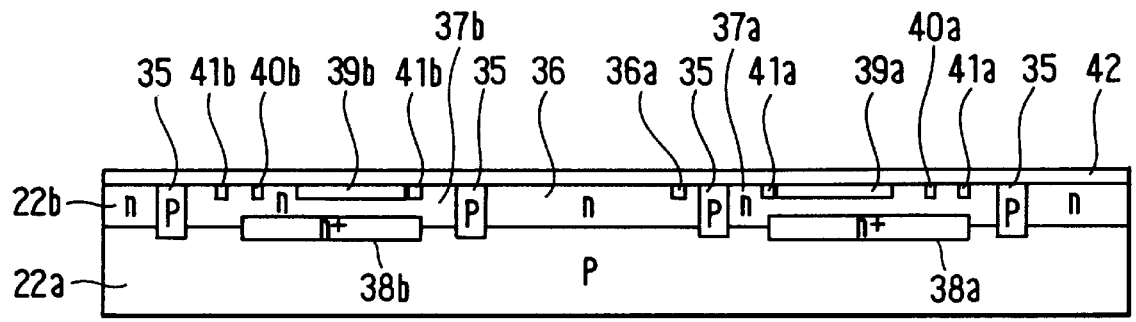

Then, as shown in FIG. 11, dopants are introduced at a high dose into the diode regions 37a, 37b, creating the n-type diffused regions 41a, 41b. Also, a heavily doped, diffused region 36a used for making contacts with the conductor pattern 32 is formed in the diaphragm region 36.

Figure 12:
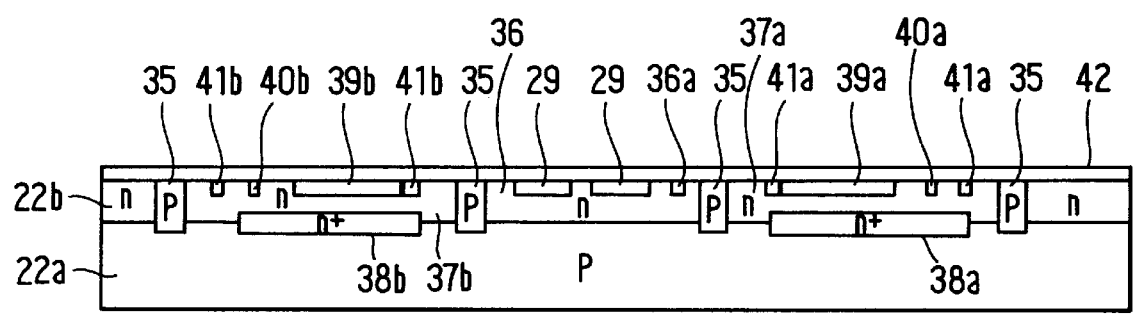

As shown in FIG. 12, dopants are then introduced into the diaphragm region 36 at a high dose to form the p-type diffused resistors 29 exhibiting a piezoresistance effect.

Figure 13:
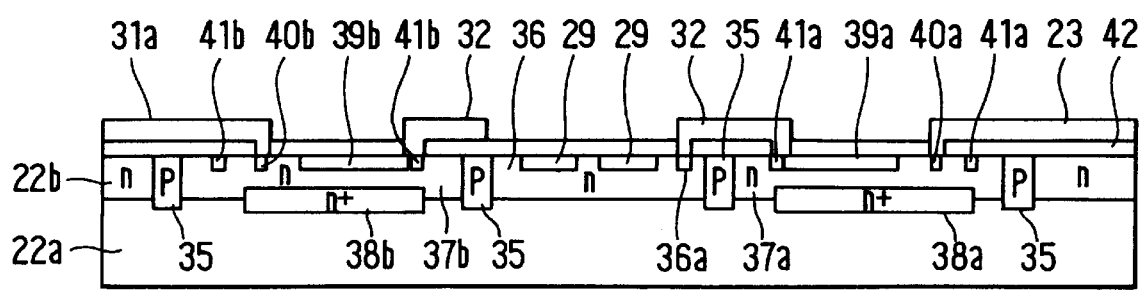

Then, as shown in FIG. 13, the conductor patterns 23, 31a and 32 are formed by patterning (e.g., by a photolithographic process) an aluminum film formed by evaporation or other method.

Figure 14:
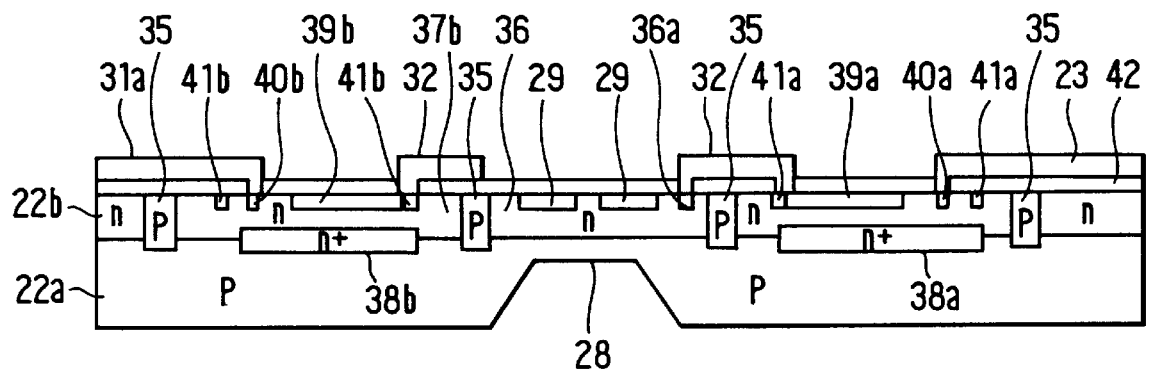
Figure 15:
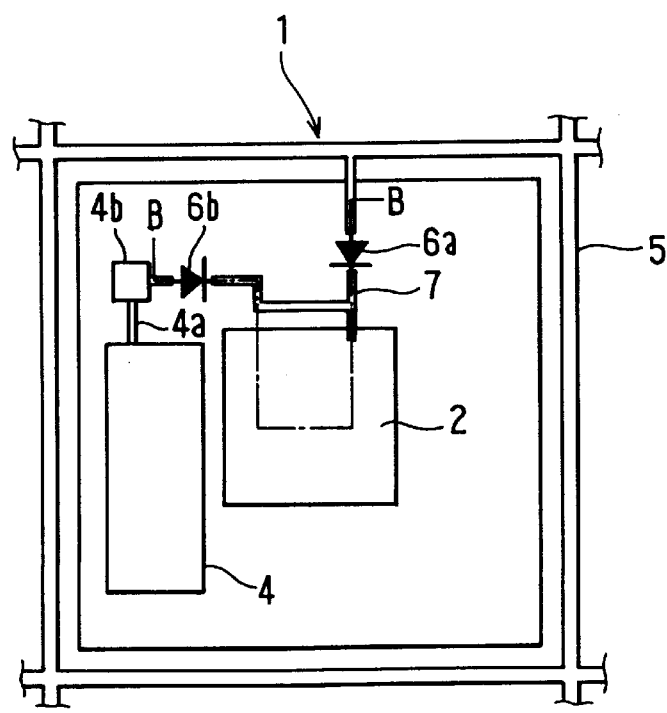
FIG. 15 is a top view of the prior art sensor chip.
Figure 16:
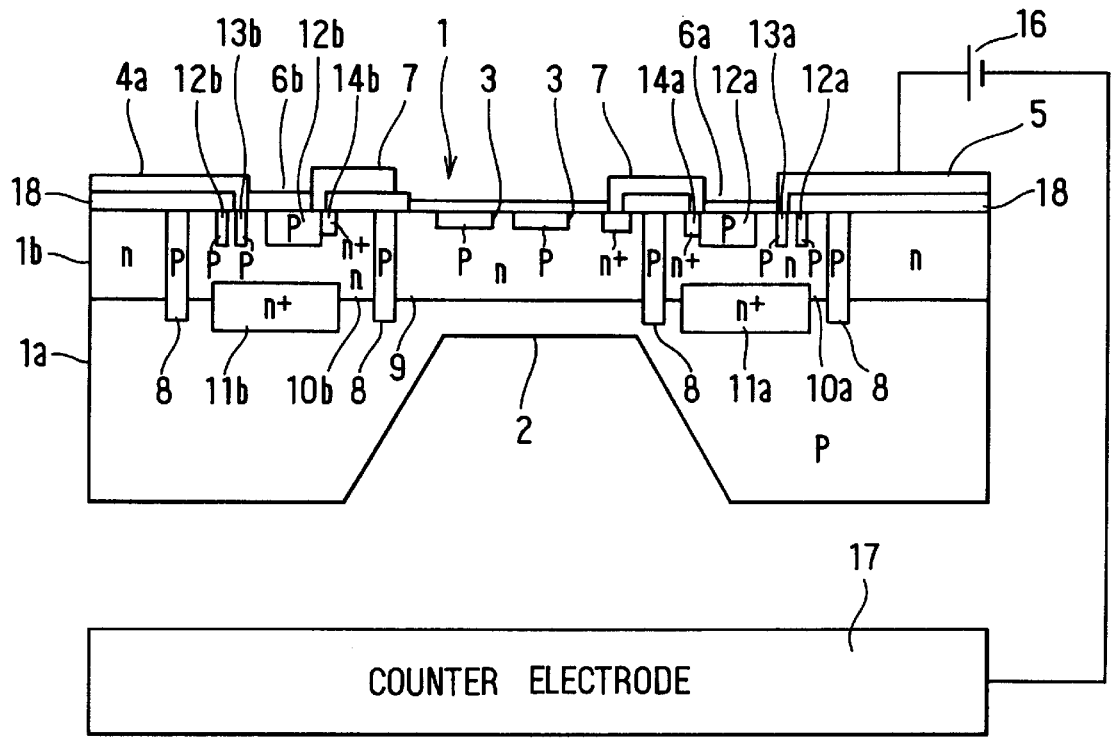
FIG. 16 is a schematic cross section taken along line B—B of FIG. 15.
Figure 17:
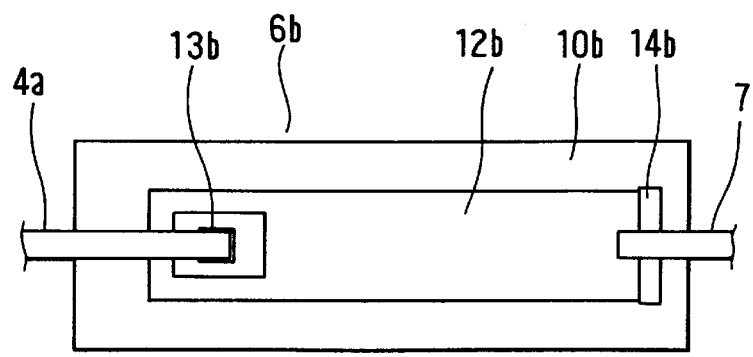
FIG. 17 is a top view of a diode portion of the prior art sensor chip shown in FIGS. 15 and 16.
Figure 18:
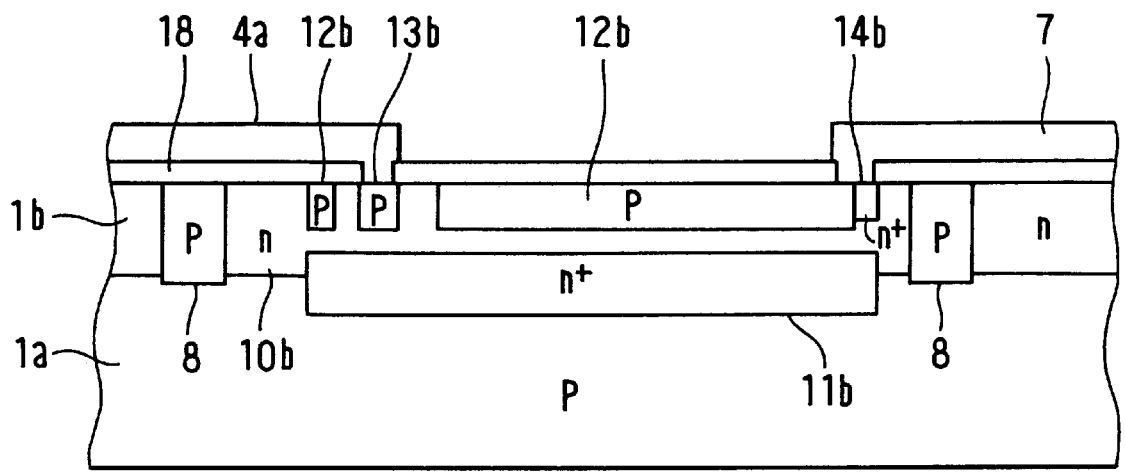
FIG. 18 is a schematic cross section of the diode portion shown in FIG. 17.
Figure 19:
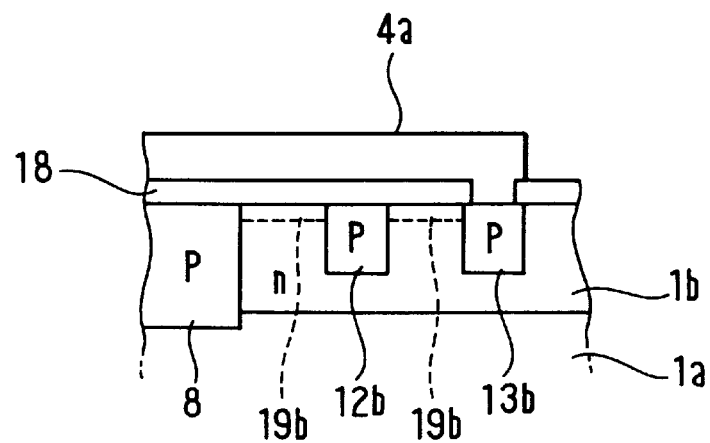
FIG. 19 is a fragmentary cross section of a parasitic MOS transistor produced in the diode portion shown in FIGS. 17 and 18.

As a final step of the processing of the wafer, electrochemically stopped etching is performed, as shown in FIG. 14. That is, the rear side of the diaphragm region 36 is anisotropically etched to a desired depth, thus forming the diaphragm portion 28.

The aforementioned electrochemically stopped etching step illustrated in FIG. 14 is next described in detail. Referring to FIG. 6, during the electrochemically stopped etching, the silicon wafer 21 is immersed in KOH solution 27a within the etch bath 27 while applying a voltage from the external power supply 25. The KOH solution 27a is an etchant used in anisotropically etching silicon. Consequently, the diaphragm portion 28 is quickly etched in the direction of thickness.

During this electrochemically stopped etching processing, a voltage is applied to each sensor chip 22 of the silicon wafer 21 from the positive terminal of the external power supply 25 via the electrode portion 24 and via the conductor pattern 23. In each sensor chip 22, a voltage is applied from the conductor pattern 23 to the n-type diaphragm region 36 of the diaphragm portion 28 via the first diode portion 33. This causes a depletion layer to spread from the p-n junction between the diaphragm region 36 and the silicon substrate 22a.

It is to be noted that the width of this depletion layer controls the dimensions of the diaphragm portion 28 to be left by etching. To extend the range of controllable dimensions, a structure capable of increasing the applied voltage to a maximum is necessary. In the construction of the present embodiment, the first and second diode portions 33 and 34 adopt the leakage-current hindering structure. Therefore, if a relatively high voltage is applied, the produced leakage current is minimized.

In the first diode portion 33, the voltage applied to the emitter region 40a from the conductor pattern 23 creates a current path via the diode region 37a and via the n-type diffused region 41a. As a result, a voltage is impressed on the diaphragm portion 36 from the conductor pattern 32. Since a negative voltage (0 V) is applied to the counter electrode 26 immersed in the etchant within the etch bath 27 at this time, a negative voltage (0 V) is applied to the p-type silicon substrate 22a of the silicon wafer 21 via the etchant 27a. It is to be noted that although a silicon layer can be etched by KOH irrespective of its conductivity type, when a potential of the silicon layer is set to 1 volt or more, the silicon layer is not etched away by KOH.

In the second diode portion 34, a positive voltage is applied to the conductor pattern 32. Therefore, there is the possibility that an inversion layer is produced in the diode region 37b immediately under the conductor pattern 31a connected with the integrated circuit 30 because the potential of the conductor pattern is relatively low. However, the p-type collector region 39b is not formed immediately under the conductor pattern 31a, because the collector region 39 is shaped like the letter "U" in a plane. Therefore, formation of any p-type channel connected with the emitter region 40b is prevented. Also, formation of any channel going from the collector region 39b to the diffused isolating region 35 is prevented, because the heavily doped n-type diffused region 41b is formed and acts as a channel stopper.

Consequently, if a comparatively high voltage is applied to the diaphragm portion 28 during the electrochemically stopped etching, leakage current flowing into the integrated circuit 30 is suppressed. Also, leakage current flowing into the silicon substrate 22a via the diffused isolating region 35 can be suppressed. In consequence, etching of the diaphragm portion 28 can be performed accurately. Furthermore, the thickness of the diaphragm portion 28 can be controlled over a wide range.

The configuration of the present embodiment can suppress a parasitic MOS effect. When a voltage of about 40 V is applied to the diaphragm portion, a leakage current of more than $1\mu$ ampere has been produced in the prior art. In the present embodiment, the leakage current can be reduced below 1 nanoampere. Therefore, the voltage applied during electrochemically stopped etching can be selected from a wide range of from 1 to 40 V.

If the purpose is only to suppress the leakage current during electrochemically stopped etching, it suffices to construct only the second diode portion 34 as described above. However, if the first diode portion 33 is also constructed as described above, the voltage supplied from the power supply pad 31 during the operation of the pressure sensor can be selected from a wider range of values.

It is to be understood that the present invention is not limited to the embodiments described above. Rather, the invention can be modified and extended as follows. For example, the leakage-current hindering portion can also be accomplished by increasing the threshold value of a parasitic MOS transistor. For instance, the thickness of the oxide film 42 or the concentration of the epitaxial layer 22b on the silicon substrate 22a can be set greater to increase the threshold value. Further, the present invention can also be applied to the case in which a thin-walled beam portion is formed in an accelerating sensor or the like that is a semiconductor device etched by electrochemically stopped etching processing.

What is claimed is:

1. A semiconductor device having a thin-walled portion formed in a predetermined region of a semiconductor substrate by electrochemically stopped etching, said semiconductor device comprising:

a circuit portion electrically connected with said thin-walled portion;

a first diode portion for suppressing reverse current, said first diode portion being located in a current path going from outside to said thin-walled portion during said electrochemically stopped etching;

a second diode portion for suppressing reverse current, said second diode portion being located in a current path going from said circuit portion to said thin-walled portion; and a leakage-current hindering portion formed in said second diode portion for hindering a leakage current from flowing through a leakage current path created by a parasitic element produced by a voltage applied during said electrochemically stopped etching.

2. The semiconductor device according to claim 1, wherein said leakage-current hindering portion is formed as a channel stop region for providing a channel stop in a parasitic MOS structure formed by an electrode pattern connected with said second diode portion.

3. The semiconductor device according to claim 1, wherein said leakage-current hindering portion is formed by disposing a diffused region offset from immediately under an electrode pattern connected with said second diode portion, said diffused region being either of a drain and a source of a parasitic MOS structure.

4. The semiconductor device according to claim 1, wherein each of said diode portions is formed by shorting collector and base of a lateral transistor to each other by an electrode pattern, said lateral transistor being fabricated on said semiconductor substrate.

5. The semiconductor device according to claim 1, wherein said thin-walled portion acts as a diaphragm displaced in response to an external pressure, and wherein diffused resistors of which resistance values are varied according to magnitude of said pressure are formed on said diaphragm.

6. A semiconductor device having a thin-walled portion formed in a predetermined region of a semiconductor substrate by electrochemically stopped etching, said semiconductor device comprising:

a circuit portion electrically connected with said thin-walled portion;

a first diode portion disposed between said circuit portion and said thin-walled portion for preventing current from flowing from said thin-walled portion to said circuit portion when a voltage is applied to said thin-walled portion to perform said electrochemically stopped etching; and a first leakage-current hindering portion formed in said first diode portion for hindering a leakage current from flowing through a leakage current path created by a parasitic element produced by said voltage applied during said electrochemically stopped etching.

7. The semiconductor device according to claim 6, further comprising a second diode portion disposed in a current path between said thin-walled portion and a terminal to be connected with an external power source for performing said electrochemically stopped etching, said diode preventing current from flowing from said thin-walled portion to said terminal during operation of said semiconductor device.

8. The semiconductor device according to claim 7, further comprising a second leakage-current hindering portion formed in said second diode portion for hindering a leakage current from flowing through a leakage current path created by a parasitic element produced by a voltage applied during operation of said semiconductor device.

9. The semiconductor device according to claim 6, wherein said first leakage-current hindering portion is formed as a channel stop region for providing a channel stop in a parasitic MOS structure formed by an electrode pattern connected with said first diode portion.

10. The semiconductor device according to claim 6, wherein said first leakage-current hindering portion is formed by disposing a diffused region offset from immediately under an electrode pattern connected with said first diode portion, said diffused region being either of a drain and a source of a parasitic MOS structure.

11. The semiconductor device according to claim 6, wherein said first diode portion is formed by shorting collector and base of a lateral transistor to each other by an electrode pattern, said lateral transistor being fabricated on said semiconductor substrate.

12. The semiconductor device according to claim 6, wherein said thin-walled portion acts as a diaphragm displaced in response to an external pressure, and wherein diffused resistors of which resistance values are varied according to magnitude of said pressure are formed on said diaphragm.

13. A method of fabricating a semiconductor device comprising a circuit portion, a first diode portion disposed in a current path between a predetermined region of a semiconductor substrate and a terminal to be connected with an external power source for performing electrochemically stopped etching, said first diode portion preventing current from flowing from said predetermined region to said terminal, a second diode portion disposed between said circuit portion and said predetermined region for preventing current from flowing from said predetermined region to said circuit portion when a voltage is provided from said external power source during electrochemically stopped etching, and a leakage-current hindering portion formed in said second diode portion for hindering a leakage current from flowing through a leakage current path created by a parasitic element produced by said voltage provided from said external power source, said method comprising:

a step of forming a thin-walled portion at said predetermined region by carrying out electrochemically stopped etching.

14. The method of fabricating a semiconductor device according to claim 13, wherein said semiconductor substrate includes a p-type semiconductor substrate and a n-type epitaxial layer formed thereon, and a positive potential is applied to said n-type epitaxial layer during said electrochemically stopped etching.

15. The method of fabricating a semiconductor device according to claim 14, wherein said n-type epitaxial layer is provided with a potential of equal to or more than 1 volt and said p-type semiconductor substrate is provided with a potential of lower than 1 volt.

* * * * *